United States Patent
Todorov et al.

(10) Patent No.: US 6,435,807 B1
(45) Date of Patent: Aug. 20, 2002

(54) INTEGRATED EDGE GRIPPER

(75) Inventors: Alexander Todorov, Sunnyvale; Mila Genov, San Jose, both of CA (US)

(73) Assignee: Genmark Automation, Sunnyvale, CA (US)

( * ) Notice: Subject to any disclaimer, the term of this patent is extended or adjusted under 35 U.S.C. 154(b) by 0 days.

(21) Appl. No.: 09/735,535

(22) Filed: Dec. 14, 2000

(51) Int. Cl.$^7$ ................................. B65G 49/07
(52) U.S. Cl. ................. 414/757; 414/783; 414/936; 414/941
(58) Field of Search .................. 198/394; 414/783, 414/936, 941, 757

(56) References Cited

U.S. PATENT DOCUMENTS 4,685,206 A * 8/1987 Kabayashi et al. ..... 414/936 X
4,770,590 A * 9/1988 Hugues et al. ............... 414/172
5,102,291 A * 4/1992 Hine ........................ 414/936 X
6,012,192 A * 1/2000 Sawada et al. ......... 414/936 X

* cited by examiner

*Primary Examiner*—Janice L. Krizek
(74) *Attorney, Agent, or Firm*—Thelen, Reid & Priest LLP; Robert E. Krebs

(57) ABSTRACT

A semiconductor processing robot is provided with a robot arm on which is mounted an integrated edge gripper having an orienting assembly and a detecting assembly. The orienting assembly operates to rotate a substrate such that a substrate reference marking, or indicium, is positioned at the detecting assembly. The detecting assembly detects the location of the reference indicium and thereby derives information about the relative orientation of the substrate in the integrated edge gripper.

13 Claims, 4 Drawing Sheets

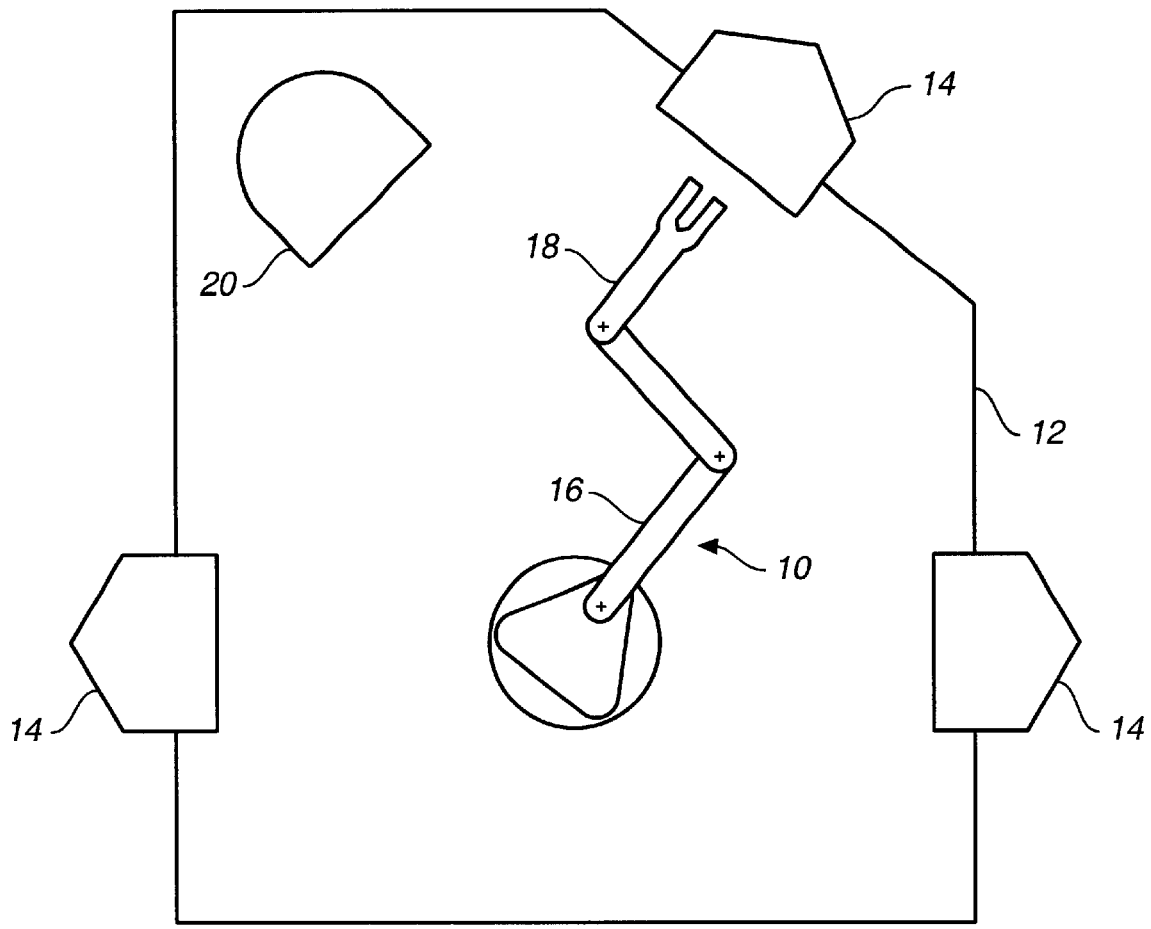
FIG._1

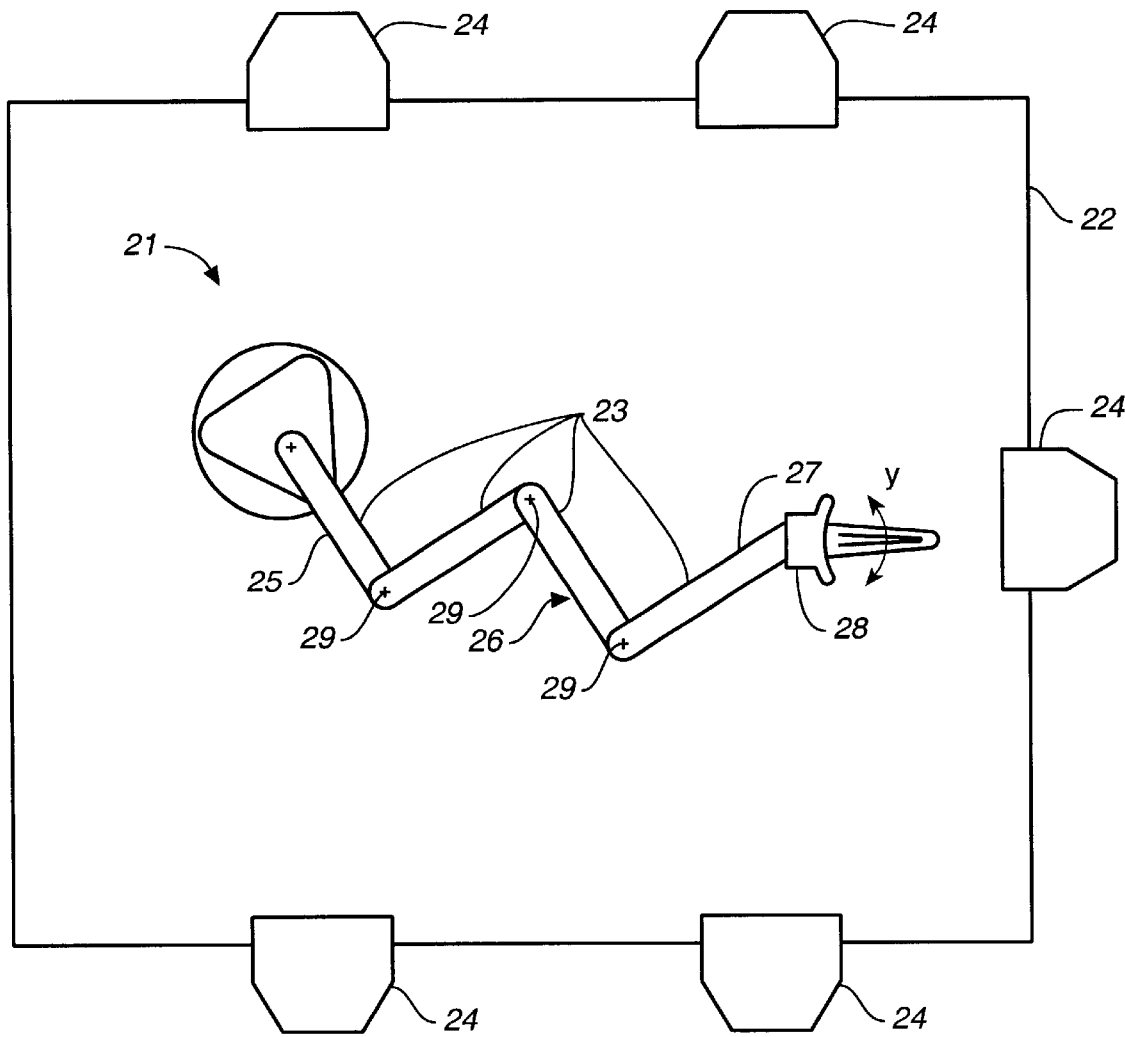
FIG._2
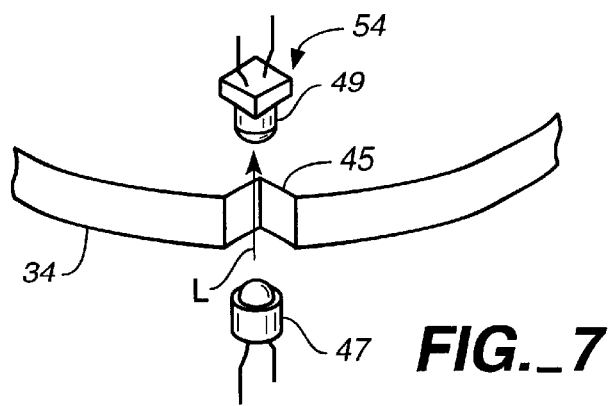
FIG._7

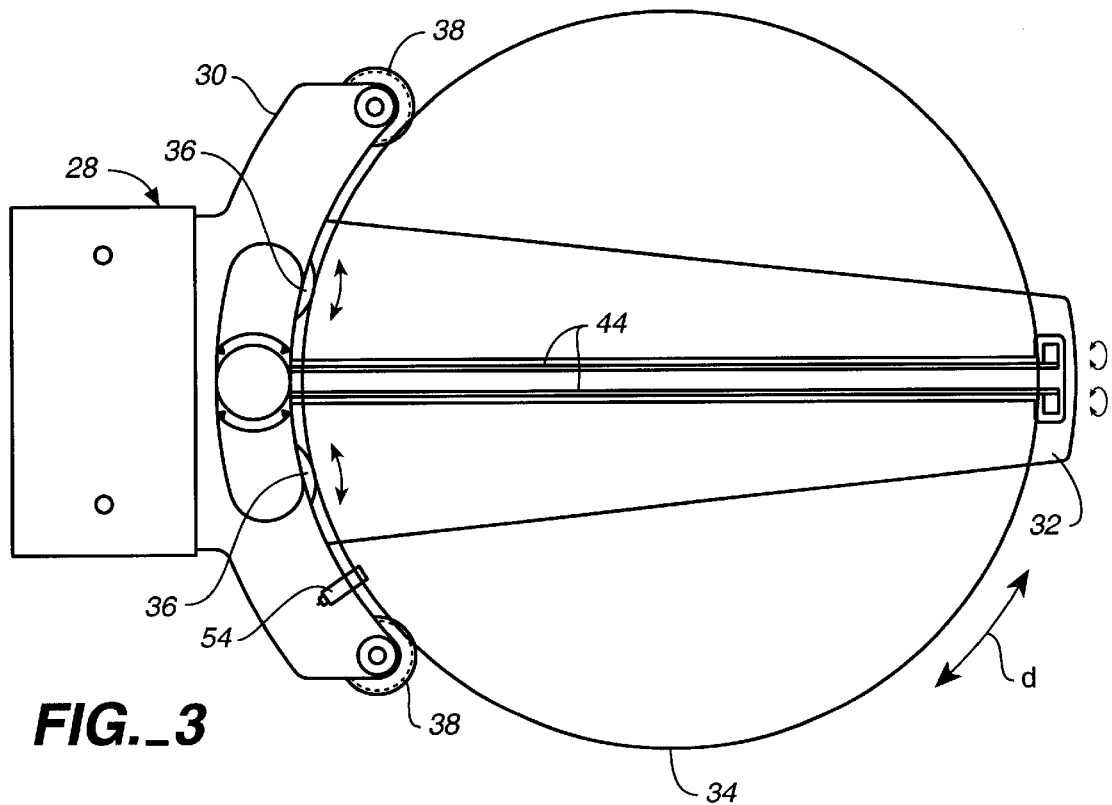
FIG._3
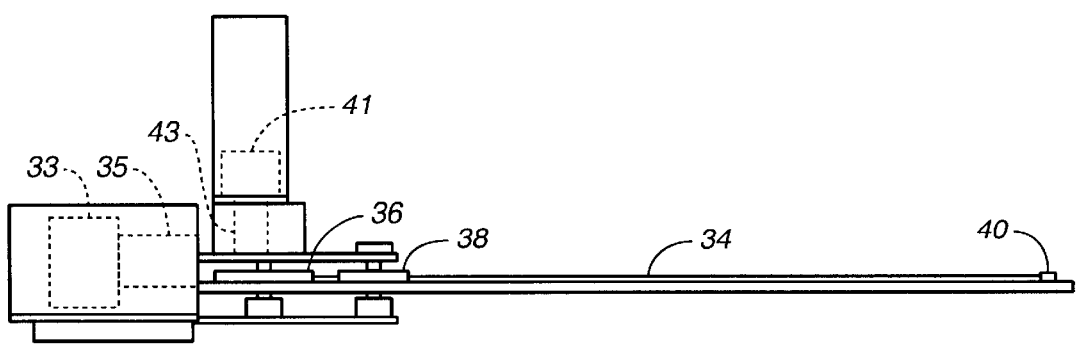
FIG._4

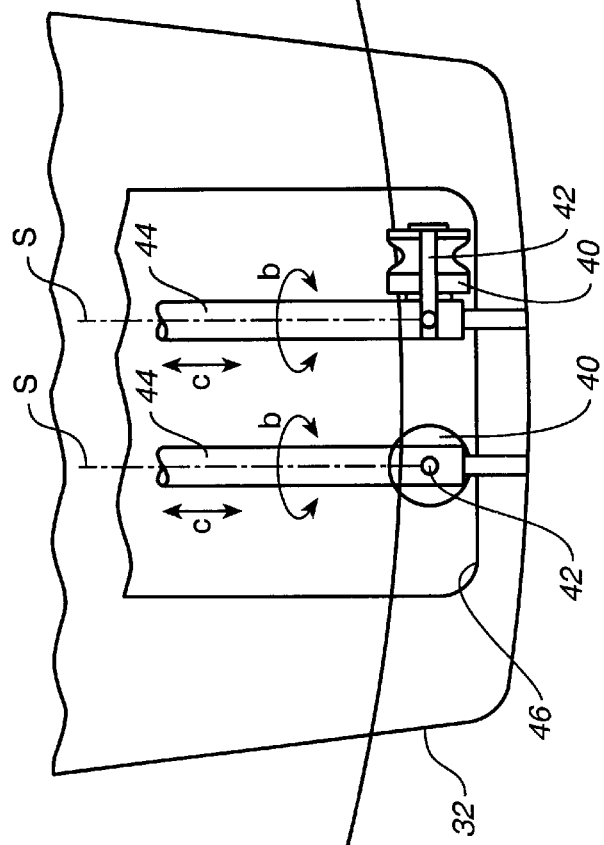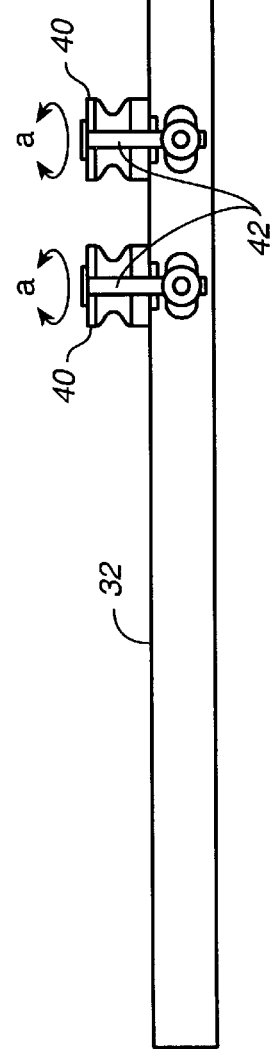

INTEGRATED EDGE GRIPPER

CROSS-REFERENCE TO RELATED APPLICATIONS (Not applicable)

BACKGROUND OF THE INVENTION

1. Field of the Invention

The invention relates to semiconductor processing devices, and more particularly to robots used to transport semiconductor substrates between processing stations and/or storage stations.

2. Description of Related Art

FIG. 1 shows a prior art semiconductor processing system in which a robot 10 is enclosed within a micro-environment enclosure 12. Various processing stations 14, which may include storage cassettes for holding a plurality of stacked substrates (not shown), are in communication with the micro-environment within the enclosure. Robot 10 is provided with a robot arm 16 which supports an end effector 18 used to hold semiconductor substrates as these are retrieved from the various stations 14. Disposed within micro-environment enclosure 12 is an alignment device 20 to which the semiconductor substrates are transported by robot arm 16 in order to determine and/or adjust the orientation of the semiconductor substrates. To that end, substrates such as wafers are provided with a notch at the edge, which notch is suitably detected by, for example, a photoelectric sensor provided in alignment device 20. During operation, robot 10, for example, retrieves a wafer from one of the stations 14, transports the wafer to alignment device 20 where its orientation is determined and/or adjusted, then deposits the wafer at a different station (or the same station) 14.

The aforementioned prior art system introduces several additional steps associated with the alignment device 20. For example, the substrate has to first be transported to the alignment device 20 and deposited therein, then after orientation determination and/or adjustment, the substrate has to be retrieved from alignment device 20 and then transported to the destination station. This represents a disruption in the flow path and introduces various steps which increase processing time and potential malfunction.

BRIEF SUMMARY OF THE INVENTION

The invention overcomes deficiencies of the prior art by providing a system in which the substrate transporting robot is itself capable of determining the orientation of the substrate and changing this orientation. Specifically, in accordance with the invention, there is provided a robot for transporting a substrate having a reference indicium which comprises a robot arm on which an integrated edge gripper is mounted. The integrated edge gripper includes an orienting assembly for orienting the substrate such that the reference indicium is at a predetermined position in the integrated edge gripper, and a detecting assembly adapted to generate a signal indicative of the presence of the reference indicium at the predetermined position.

Further in accordance with the invention, an alignment device for use with a substantially circular substrate having a reference indicium is disclosed. The alignment device is provided with a detecting assembly adapted to generate a signal indicative of the presence of the reference indicium at a predetermined position in the alignment device and an orienting assembly for orienting the substrate such that the reference indicium is at the predetermined position. The orienting assembly includes a first set of one or more wheels each adapted to engage the edge of the substrate and each being mounted for rotation about a corresponding wheel axis; a second set of one or more wheels each adapted to engage the edge of the substrate in an engagement position and each being mounted for rotation about a corresponding wheel axis and for movement between the engagement position and a disengagement position; a first mechanical assembly, including a first motor, for rotating at least one wheel of the first set of wheels, wherein said rotation causes rotation of the substantially circular substrate; and a second mechanical assembly for moving the second set of wheels between the engagement and disengagement positions.

BRIEF DESCRIPTION OF THE SEVERAL VIEWS OF THE DRAWING(S)

Many advantages of the present invention will be apparent to those skilled in the art with a reading of this specification in conjunction with the attached drawings, wherein like reference numerals are applied to like elements and wherein:

FIG. 1 is a schematic top plan view of a conventional semiconductor processing system;

FIG. 2 is a schematic top plan view of a processing system in accordance with the invention;

FIG. 3 is a is a top plan view of an integrated edge gripper in accordance with the invention;

FIG. 4 is a side elevational view of an integrated edge gripper in accordance with the invention;

FIG. 5 is a partial top plan view of an integrated edge gripper in accordance with the invention;

FIG. 6 is a partial front elevational view of an integrated edge gripper in accordance with the invention; and FIG. 7 is a is a perspective view of a detecting assembly in accordance with invention.

DETAILED DESCRIPTION OF THE INVENTION

FIG. 2 shows a robot 21 in accordance with the invention. Robot 21 is disposed within a micro-environment enclosure 22 which is in communication with a plurality of processing stations and/or storage locations 24. Robot 21 is provided with an articulated robot arm 26 having one or more links 23 which are pivotably mounted relative to one another for rotation about pivot points 29 and which extend between relatively movable proximal (25) and distal (27) portions. Motion of the links is effected using one or more servo motors (not shown) and mechanical linkages, including for example belts and pulleys (not shown), as is known in the art. Robot 21 may also be of the GPR (Global Positioning Robot) type wherein it is capable of a tilting motion along the Z-axis (normal to the plane of the drawing figure).

An integrated edge gripper 28 is mounted at the distal portion 27 so as to also be relatively movable with respect to the proximal portion 25. Integrated edge gripper 28 may also be mounted for movement relative to distal portion 27, in order to achieve additional degrees of freedom, which may include yaw motion in the direction of double-arrow y. Robot arm 26 operates in conjunction with integrated edge gripper 28 to transport semiconductor substrates (not shown) between the various stations 24 for processing. A processor (not shown) issues command signals to the servo motors associated with the links of robot arm 26 and with integrated edge gripper 28 in order to realize motion trajectories suitable for the transport tasks of robot 21.

FIG. 3 and FIG. 4 show in greater detail integrated edge gripper 28, which comprises an orienting assembly and a detecting assembly indicated respectively at 30 and 54. Also shown is a substantially circular substrate 34 supported by integrated edge gripper 28.

As seen from FIG. 4, substrate 34 is supported by its edges using a first set of rotatable wheels 36 and 38 provided with orienting assembly 30. Substrate 34 is also supported, by its edges, using a second set of rotatable wheels 40, which, as seen from FIG. 5, are mounted on rotatable rods 44 extending in cut-out portion 46 of support frame 32. To retain substrate 34, wheels 36 and 38 are provided with a v-shaped groove which accommodates the edge of the substrate 34. Similarly, wheels 40 at the other side of substrate 34 are provided with a v-shaped groove at a central portion thereof. In this manner, substrate 34 is effectively suspended by its edges and can rotate unhindered.

Wheels 40 are shown in greater detail in FIGS. 5 and 6. Wheels 40 are freely rotatable, in the directions a, about pins 42 extending along the wheel axes. Pins 42 are mounted in rods 44 which rotate axially in the direction indicated by arrows b (about axes s). This rotation of rods 44 enables wheels 40, mounted thereto, to be rotated between an engagement position and a disengagement position. In the engagement position, shown mainly in FIGS. 4 and 6, the wheels are configured to engage the edge of substrate 34, with their axes being orthogonal to the surface of the substrate. In the disengagement position, wheels 40 "fold" into cut-out portion 46, so as to lie outside the plane of the substrate, thereby reducing the profile of the front of integrated edge gripper 28 and enabling the integrated edge gripper to slide between a stack of substrates in which there is minimal clearance, such as in a storage cassette comprising a station 24 during a substrate retrieval or deposit operation depicted in FIG. 3. Wheels 40 are then brought to the engagement position by rotating the rods 44 to the upright position when integrated edge gripper 28 is properly positioned beneath a substrate which is about to be picked up from a rest position at the station 24. Such proper positioning includes the engagement of wheels 36 and 38 with the edge of the substrate 34. After wheels 40 are rotated by rods 44 to the engagement position, the rods are moved axially, along axes s, in the direction indicated at c, in order to eliminate the clearance necessary to permit motion of wheels 40 from the disengagement to the engagement positions and to take up the slack engendered by the depth of the v-shaped grooves provided in wheels 40. The axial motion c of rods 44 thus fully engages wheels 40 with the substrate 34, and permits the substrate to be picked up and transported by robot 21. This process, of course, is reversed when a transported substrate 34 is being deposited at a processing station 24. Motion of rods 44 is preferably mechanically linked, and may be provided by one or more servo motors 33 connected by a mechanical linkage 35 to rods 44.

While wheels 40 are preferably freely rotating, at least one of the wheels of the first set—that is, wheels 36 and 38—is a drive wheel which is mechanically linked to a servo motor 41 via a suitable mechanical linkage 43. It is preferred that wheels 36 be configured as the drive wheels. The mechanical linkage can comprise any combination of belts and/or pulleys (not shown), as is known in the art. Motor 41 causes rotation of a wheel 36 (or 38), which in turn rotates the substantially round substrate 34, whose edge is supported in the v-shaped groove of the wheels, in the direction indicated at d. The other wheels, including wheels 40, are idle wheels—that is, they provide no rotation power—and rotate freely in conjunction with the rotation of the substrate 34. The size, number and spacing of wheels 40, which are preferably smaller than wheels 36 and 38, is selected so as not to interfere with rotation of substrate 34. Also, while in the drawing figures the first set of wheels is depicted as containing four wheels, it will appreciated that any number of wheels can be used, depending on the particular design.

As seen in FIG. 7, substrate 34 is provided with a reference indicium 45, in the form of a v-shaped notch, at an edge thereof. Wheel 36 rotates substrate 34 such that indicium 45 is rotated to the position of detecting assembly 54, which is preferably an edge detector comprising a light emitter 47 and a light detector 49 mounted in a confronting relationship. The presence of indicium 45 at the position of the edge detector permits passage of light L from emitter 47 to detector 49, causing a detection signal to issue from detector 49 to thereby indicate a particular relative orientation of the substrate 34 in integrated edge gripper 28. Knowledge of this relative orientation can be combined with knowledge of the position of integrated edge gripper 28 by robot 21 to provide more general orientation information of the substrate, if necessary, in a straightforward manner whose details are outside the purview of the present invention. Of course, once the relative orientation is known, the substrate 34 can be rotated by motor 41 to change the orientation as necessary to suit the requirements of the stations 24 in which the substrate is to be deposited by robot arm 26. Again the details of the orientational changes and adjustment are relatively straightforward and are not the subject of the present discussion. The procedures of orientation determination and adjustment described above can be performed while the substrate is being transported from one station 24 to another. Alternatively, robot arm 26 can serve to provide an orientation detection and adjustment mechanism which is effectively delivered to the wafer, whereby the integrated edge gripper 28 is brought to the location of the substrate 34 and operates to determine the orientation of the substrate and adjust it if necessary, without necessarily changing the general location of the substrate within the processing system.

The above are exemplary modes of carrying out the invention and are not intended to be limiting. It will be apparent to those of ordinary skill in the art that modifications thereto can be made without departure from the spirit and scope of the invention as set forth in the following claims.

What is claimed is:

1. A robot for transporting a substrate having a reference indicium, the robot comprising:

a robot arm having at least first and second links disposed between relatively movable proximal and distal portions, wherein the first and second links are pivotably connected to one another at a first end of the second link, and the second link and distal portion are pivotably connected to one another at a second, opposite end of the second link; and an integrated edge gripper mounted at the distal portion of the robot arm such that the integrated edge gripper is movable with respect to the proximal portion, the integrated edge gripper being adapted to support the substrate and comprising:

an orienting assembly for orienting the substrate such that the reference indicium is at a predetermined position in the integrated edge gripper; and a detecting assembly adapted to generate a signal indicative of the presence of the reference indicium at the predetermined position.

2. The robot of claim 1, wherein the detecting assembly comprises an edge detector.

3. The robot of claim 2, wherein the edge detector comprises a light source and a light detector arranged in a confronting relationship such that when the substrate is in the integrated edge gripper, light from the light source causes the light detector to issue a detection signal responsive to light from the light source only when the reference indicium is at the predetermined position.

4. An alignment device for use with a substantially circular substrate having a reference indicium, the alignment device comprising:
   a detecting assembly adapted to generate a signal indicative of the presence of the reference indicium at a predetermined position in the alignment device; and
   an orienting assembly for orienting the substrate such that the reference indicium is at the predetermined position, the orienting assembly comprising:
      a first set of one or more wheels each adapted to engage the edge of the substrate and each being mounted for rotation about a corresponding wheel axis;
      a second set of one or more wheels each adapted to engage the edge of the substrate in an engagement position and each being mounted for rotation about a corresponding wheel axis and for movement between the engagement position and a disengagement position;
      a first mechanical assembly, including a first motor, for rotating at least one wheel of the first set of wheels, wherein said rotation causes rotation of the substantially circular substrate; and
      a second mechanical assembly for moving the second set of wheels between the engagement and disengagement positions,
      wherein the second mechanical assembly includes a set of rods each associated with a wheel of the second set of wheels, each rod having the associated wheel rotatably mounted thereon about said wheel axis and each rod being rotatably mounted about an axis which is transverse to the wheel axis of the associated wheel, wherein rotation of a rod causes movement of an associated wheel between the engagement and disengagement positions.

5. The device of claim 4, wherein the second mechanical assembly further includes a second motor which is mechanically linked to the set of rods such that motion of the second motor rotates each rod of the set of rods.

6. The device of claim 4, wherein the rods each have a longitudinal axis and are movable along said longitudinal axis.

7. An alignment device for use with a substantially circular, planar substrate having a reference indicium, the alignment device adapted to support the substrate in a support position relative to the alignment device, comprising:
   a detecting assembly adapted to generate a signal indicative of the presence of the reference indicium at a predetermined position in the alignment device; and
   an orienting assembly for orienting the substrate such that the reference indicium is at the predetermined position, the orienting assembly comprising:
      a first set of one or more wheels each adapted to engage the edge of the substrate and each being mounted for rotation about a corresponding wheel axis;
      a second set of one or more wheels each adapted to engage the edge of the substrate in an engagement position and each being mounted for rotation about a corresponding wheel axis and for movement between the engagement position and a disengagement position;
      a first mechanical assembly, including a first motor, for rotating at least one wheel of the first set of wheels, wherein said rotation causes rotation of the substantially circular substrate; and
      a second mechanical assembly for moving the second set of wheels between the engagement and disengagement positions, wherein, in the disengagement position, the wheels of the second set lie outside the plane of the substrate when the substrate is in the support position.

8. The device of claim 7, wherein the detecting assembly comprises an edge detector.

9. The device of claim 8, wherein the edge detector comprises a light source and a light detector arranged in a confronting relationship such that when the substrate is in the alignment device, light from the light source causes the light detector to issue a detection signal responsive to light from the light source only when the reference indicium is at the predetermined position.

10. A robot for transporting a substrate having a reference indicium, the robot comprising:
    a robot arm having one or more links disposed between relatively movable proximal and distal portions; and
    an integrated edge gripper mounted at the distal portion of the robot arm such that the integrated edge gripper is movable with respect to the proximal portion, the integrated edge gripper being adapted to support the substrate and comprising:
       an orienting assembly for orienting the substrate such that the reference indicium is at a predetermined position in the integrated edge gripper; and
       a detecting assembly adapted to generate a signal indicative of the presence of the reference indicium at the predetermined position,
    wherein the substrate is substantially circular in shape and wherein the orienting assembly comprises:
       a first set of one or more wheels each adapted to engage the edge of the substrate and each being mounted for rotation about a corresponding wheel axis;
       a second set of one or more wheels each adapted to engage the edge of the substrate in an engagement position and each being mounted for rotation about a corresponding wheel axis and for movement between the engagement position and a disengagement position;
       a first mechanical assembly, including a first motor, for rotating at least one wheel of the first set of wheels, wherein said rotation causes rotation of the substantially circular substrate; and
       a second mechanical assembly for moving the second set of wheels between the engagement and disengagement positions.

11. The robot of claim 10, wherein the rods each have a longitudinal axis and are movable along said longitudinal axis.

12. The robot of claim 10, wherein the second mechanical assembly includes a set of rods each associated with a wheel of the second set of wheels, each rod having the associated wheel rotatably mounted thereon about said wheel axis and each rod being rotatably mounted about an axis which is transverse to the wheel axis of the associated wheel, wherein rotation of a rod causes movement of an associated wheel between the engagement and disengagement positions.

13. The robot of claim 12, wherein the second mechanical assembly further includes a second motor which is mechanically linked to the set of rods such that motion of the second motor rotates each rod of the set of rods.

\* \* \* \* \*